US006957056B2

(12) United States Patent
Fitzrandolph (10) Patent No.: US 6,957,056 B2
(45) Date of Patent: Oct. 18, 2005

(54) RECEIVER AND METHOD FOR DETERMINING AN INTERMEDIATE FREQUENCY IN A WIRELESS COMMUNICATION DEVICE

(75) Inventor: David K. Fitzrandolph, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 581 days.

(21) Appl. No.: 10/109,178

(22) Filed: Mar. 28, 2002

(65) Prior Publication Data

US 2003/0186668 A1 Oct. 2, 2003

(51) Int. Cl.[7] .................................................. H04B 1/26
(52) U.S. Cl. ....................... 455/323; 455/141; 455/147; 455/131
(58) Field of Search .......................... 455/404.2, 456.1, 455/456.3, 456.6, 130, 141, 147, 552.1, 550.1, 569.2, 556.1, 323, 313, 318, 139; 342/357.12

(56) References Cited

U.S. PATENT DOCUMENTS

| 4,301,454 A | | 11/1981 | Bailey |
| 4,307,340 A | | 12/1981 | Inami et al. |
| 4,962,534 A | | 10/1990 | Taylor et al. |
| 5,289,505 A | * | 2/1994 | LaRosa et al. ............... 375/329 |
| 5,576,715 A | * | 11/1996 | Litton et al. ............ 342/357.12 |
| 5,600,328 A | | 2/1997 | Tachita et al. |
| 6,239,743 B1 | | 5/2001 | Lennen |
| 6,289,041 B1 | * | 9/2001 | Krasner ....................... 375/152 |
| 6,313,620 B1 | | 11/2001 | Richardson et al. |
| 6,724,807 B1 | * | 4/2004 | Krasner et al. .............. 375/143 |
| 6,829,534 B2 | * | 12/2004 | Fuchs et al. ................. 701/213 |
| 2001/0019316 A1 | * | 9/2001 | Hasegawa .............. 342/357.12 |
| 2001/0020913 A1 | * | 9/2001 | Hasegawa .............. 342/357.06 |

FOREIGN PATENT DOCUMENTS

JP 57020100 2/1982

* cited by examiner

*Primary Examiner*—Sonny Trinh
(74) *Attorney, Agent, or Firm*—S. Kevin Pickens; Kevin D. Wills; Terri S. Hughes (57) ABSTRACT

A receiver for a wireless communication device is disclosed. The receiver comprises a plurality of frequency tines coupled to receive an intermediate frequency signal, each frequency tine of the plurality of frequency tines having a pair of NCOs; a comb filter coupled to the center frequency tine of the plurality of frequency tines; and a comparator circuit coupled to said plurality of frequency tines, the comparator circuit comparing two outputs of the plurality of frequency tines. A method of determining an intermediate frequency in a wireless communication device is also disclosed. The method comprises the steps of providing a plurality of frequency tines for receiving signals at a plurality of different intermediate frequencies; determining an approximate magnitude of a frequency offset from a center frequency; and determining the sign of the frequency offset.

38 Claims, 7 Drawing Sheets

RECEIVER AND METHOD FOR DETERMINING AN INTERMEDIATE FREQUENCY IN A WIRELESS COMMUNICATION DEVICE

FIELD OF THE INVENTION

This invention relates generally to communication systems, and in particular, to a receiver and method for determining an approximate intermediate frequency in a wireless communication device.

BACKGROUND OF THE INVENTION

As wireless communication networks continue to advance, new applications for wireless technology continue to be developed. The Global Positioning System (GPS), which generally enables the determination of location information, had been limited by Selective Availability (SA), which is the intentional degradation of the standard positioning service (SPS) signals by a time varying bias. SA is controlled by the United States Department of Defense and was used to limit accuracy for non-U.S. military and government users. Although there were ways to overcome SA and provide accurate location information, such GPS receivers capable of providing accurate location information were often expensive. However, on May 1, 2000, SA was turned off, enabling highly accurate GPS receivers at a significantly lower cost.

Further, recent regulations enacted by the Federal Communications Commission (FCC) have created a new market for GPS receivers. For example, recent requirements by the FCC have required that cellular telephones provide location information to a degree of accuracy which could be provided by GPS receivers.

Another application for GPS receivers can be found in the area of telematics. Telematics is a term generally related to the provisioning of data and/or services to vehicles. One particularly beneficial aspect of a telematics system is the transmission of location information related to a vehicle in the event of an emergency condition. For example, if a vehicle is in an accident and an air bag is deployed, the telematics unit in the vehicle will automatically contact a public safety answering point (PSAP) and transfer information such as the location of the device or information related to the status of vehicle systems.

GPS receivers can be generally very sensitive to reference oscillator frequency jumps. An oscillator can have its frequency deviate if the oscillator is subjected to mechanical vibrations, which is common in portable devices which incorporate a GPS receiver. Although a very accurate oscillator can be used in a GPS receiver, such oscillators can be expensive. Prior art GPS receivers have used a single numerically controlled oscillator (NCO) per satellite signal being tracked. The DSP processor which performs the searching, acquisition, and tracking of the GPS signals controls the frequencies of the NCOs. Unfortunately, the tracking bandwidth is very narrow. As a result, if a channel is being tracked, a deviation of NCO frequency beyond the bandwidth of the tracking loop can cause the receiver to drop out of track. Once the receiver is out of track, it has to reacquire the signal which can take a few seconds of time.

Another prior art receiver uses a parallel correlator architecture in order to increase the number of correlations done per unit time, and therefore decreases the time taken to acquire a signal from a satellite. In order to acquire a signal, it is necessary to know the frequency of the of the intermediate frequency signal provided to the correlators and the code phase of the replica pseudonoise (PN) code. Often neither are known. As a result, the search process involves correlating through the entire range of code phases, one NCO frequency at a time. The NCO frequency is adjusted after the receiver has exhausted all possible code phases and has not found a large correlation value. By increasing the number correlators used during a search, the receiver will spend less time per NCO frequency. The receiver will thus be able to search through more frequency bins per unit time, thereby decreasing the time needed for the receiver to acquire a GPS signal. Although such a receiver allows for fast recovery of acquisition from a jump in oscillator frequency, it will not prevent the receiver from being knocked out of track when an oscillator jump occurs.

Accordingly, there is a need for an improved receiver and method for determining an approximate intermediate frequency in a wireless communication device which provides a high degree of protection from tracking dropout due to fluctuations in the reference oscillator frequency.

DESCRIPTION OF THE PREFERRED EMBODIMENTS

Figure 1:
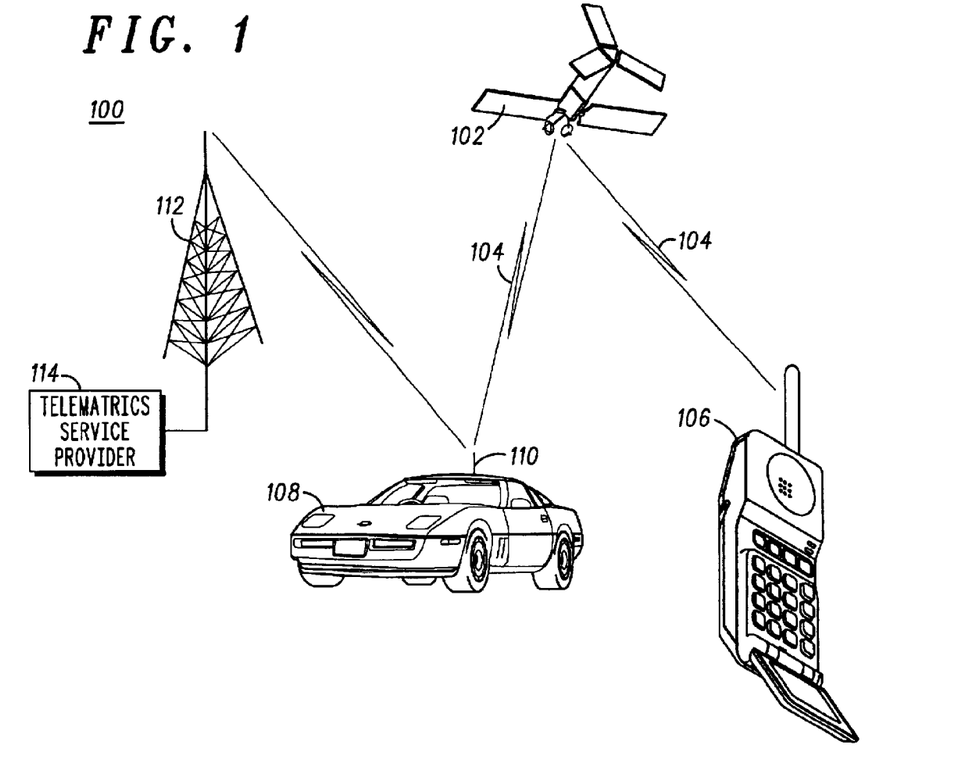
FIG. 1 is a system level diagram of a wireless communication network according to the present invention.

Turning now to FIG. 1, a wireless communication network 100 according to the present invention is shown. In particular, a satellite 102 provides satellite communication signals 104 to a wireless communication device 106 or a vehicle 108 by way of a telematics communication unit 110. The satellite 102 could be any communication satellite, such as a satellite for the global positioning system (GPS), which is well known in the art. The wireless communication device 106 could be any communication device adapted to receive wireless communication signals, such as a portable GPS receiver, or any device incorporating a GPS receiver, such as a cellular telephone having GPS capability. The telematics communication unit 110 preferably is adapted to communicate with another wireless communication network 112, such as a cellular communication network, coupled to a telematics service provider 114.

Figure 2:
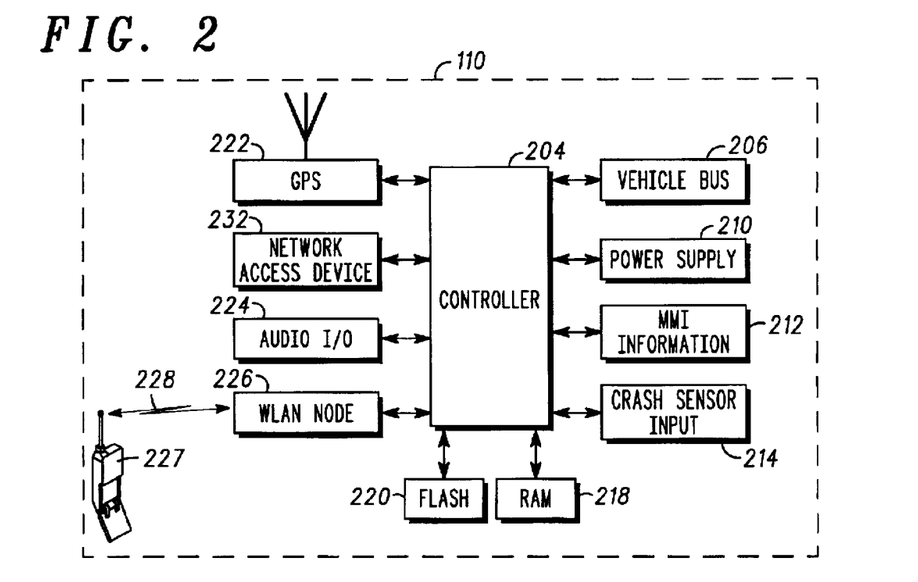
FIG. 2 is a block diagram of a telematics communication unit according to the present invention.

Turning now to FIG. 2, a block diagram of the telematics communication unit 110 according to the present invention which could be installed in the vehicle 108 of FIG. 1 is shown. The telematics communication unit 110 preferably comprises a controller 204 having various input/output (I/O) ports for communicating with various components of a vehicle. For example, the controller 204 is coupled to a vehicle bus 206, a power supply 210, a man machine interface (MMI) 212, and a crash sensor input 214. The connection to the vehicle bus enables operations such as unlocking the door, sounding the horn, flashing the lights, etc. The controller 204 is also preferably coupled to various memory elements, such as a random access memory (RAM) 218 or a flash memory 220. The telematics controller 204 also preferably includes a global positioning system (GPS) unit 222 which provides the location of the vehicle, as is well known in the art. The telematics controller 204 is also preferably coupled to an audio I/O 224 which preferably includes a hands-free system for audio communication for a user of the vehicle by way of a wireless communication network, such as a cellular telephone network.

Finally, the telematics unit 110 could include a wireless local area network (WLAN) node 226 which is also coupled to the controller 204 and enables communication between a WLAN enabled device such as a wireless communication device 227 and the telematics controller 204. The wireless communication device 227 could communicate with the WLAN enabled controller 204, and therefore, a network access device 232, by any WLAN protocol, such as Bluetooth, IEEE 802.11, IrdA, or any other WLAN application, on a communication link 228. The communication link 228 preferably provides a local, low power connection between the wireless communication device 227 and a network access device 232 of the vehicle. The network access device 232 could be, for example, a cellular telephone transceiver or other two-way wireless communication device which is well known in the art.

Figure 3:
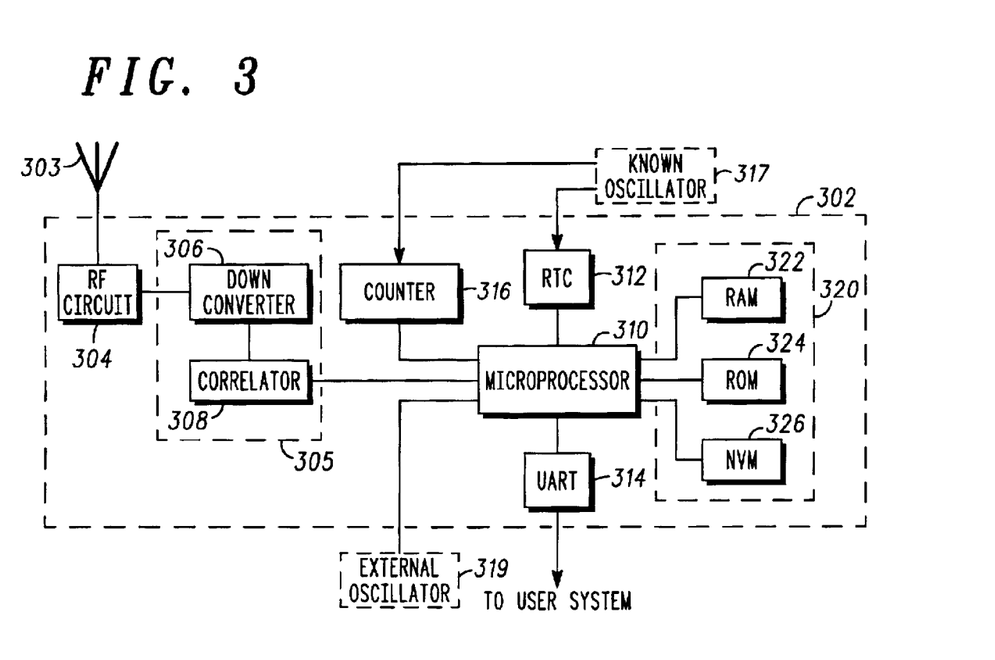
FIG. 3 is a block diagram of a wireless communication receiver according to the present invention.

Turning now to FIG. 3, a receiver 302, which could be incorporated in the GPS unit 222 or the wireless communication device 106, is coupled to an antenna 304 and comprises a radio frequency (RF) front end 305 having a downconverter 306 coupled to a correlator 308, as is well known in the art. GPS signals are received from GPS satellites, such as the wireless communication signals 104 from the satellite 102 shown in FIG. 1. The correlator 308 is coupled to a microprocessor 310. The microprocessor 310 is coupled to a real time clock (RTC) 312 and a universal asyncronous receiver/transmitter (UART) 314 which communicates with a user system. For example, the UART 314 could communicate with a controller of wireless communication device 106, controller 204 of the telematics communication unit 110, or any other device incorporating the receiver 302. The microprocessor 310 is also coupled to a counter 316. The counter 316 and the RTC 312 are coupled to a known oscillator 317. An external oscillator 319 is coupled to the microprocessor 310. The external oscillator 319 could be, for example, a crystal associated with a wireless communication device such as a cellular telephone or portable GPS unit. Finally, the microprocessor is coupled to a memory portion 320. The memory portion 320 preferably comprises a random access memory (RAM) 322, a read only memory (ROM) 324 and a non-volatile memory (NVM) 326. The elements of receiver 302 could be incorporated on a single integrated circuit (IC), or on multiple IC's. While the known oscillator 317 is shown separate from the receiver 302, the known oscillator 317 could be incorporated on an IC of the receiver 302. Similarly, the external oscillator 319 could also be incorporated on an IC associated with the receiver 302.

Figure 4:
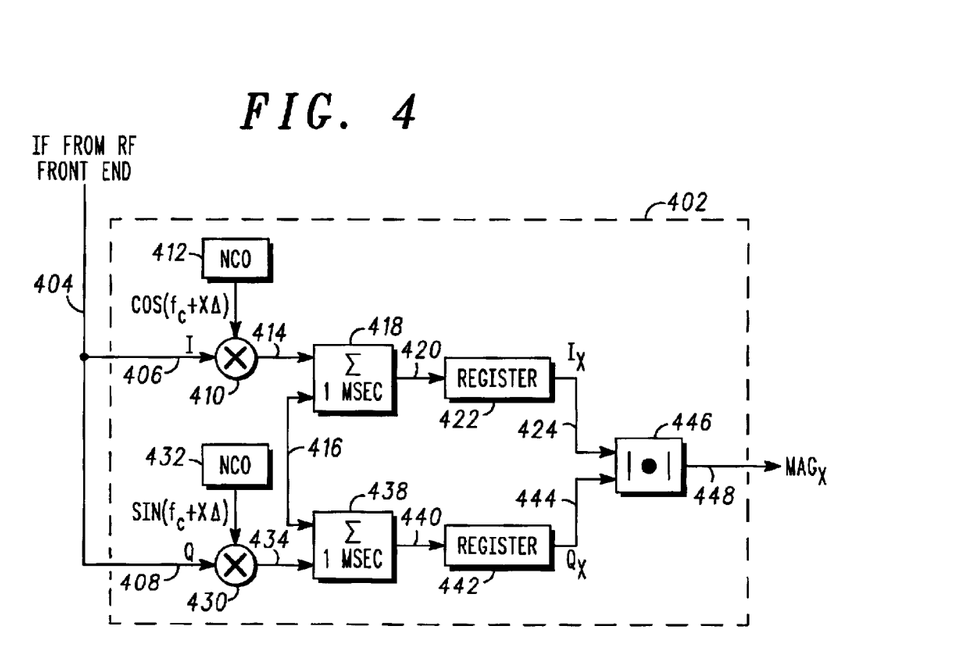
FIG. 4 is a block diagram of a frequency tine according to the present invention.

Turning now to FIG. 4, a block diagram of a frequency tine 402 according to the present invention is shown. The frequency tine 402 could be used, for example, in the RF front end 305. The frequency tine 402 receives an IF signal 404 which comprises an I component 406 and a Q component 408. The I component 406 is coupled to a first mixer 410. The first mixer 410 also receives a signal from a numerically controlled oscillator (NCO) 412. A first mixer output 414 and a prompt replica PN code 416 are coupled to a correlator 418. A correlator output 420 is then coupled to a latched register 422 which stores the correlator output 420 and generates an I component output 424. Similarly, the Q component 408 is coupled to a second mixer 430 which receives an input from a second NCO 432. A second mixer output 434 is also coupled with the prompt replica PN code 416 to a correlator 438. A correlator output 440 is coupled to a latched register 442, which stores the correlator output 440 and generates a Q component output 444. The I component output 424 and the Q component output 444 are coupled to a summer 446, which generates a magnitude value 448, which is preferably a single, real number. Accordingly, the value of the numerically controlled oscillators 412 and 432 and the received intermediate frequency 404 will determine the magnitude value 448 at the output of the summer 446.

Figure 5:
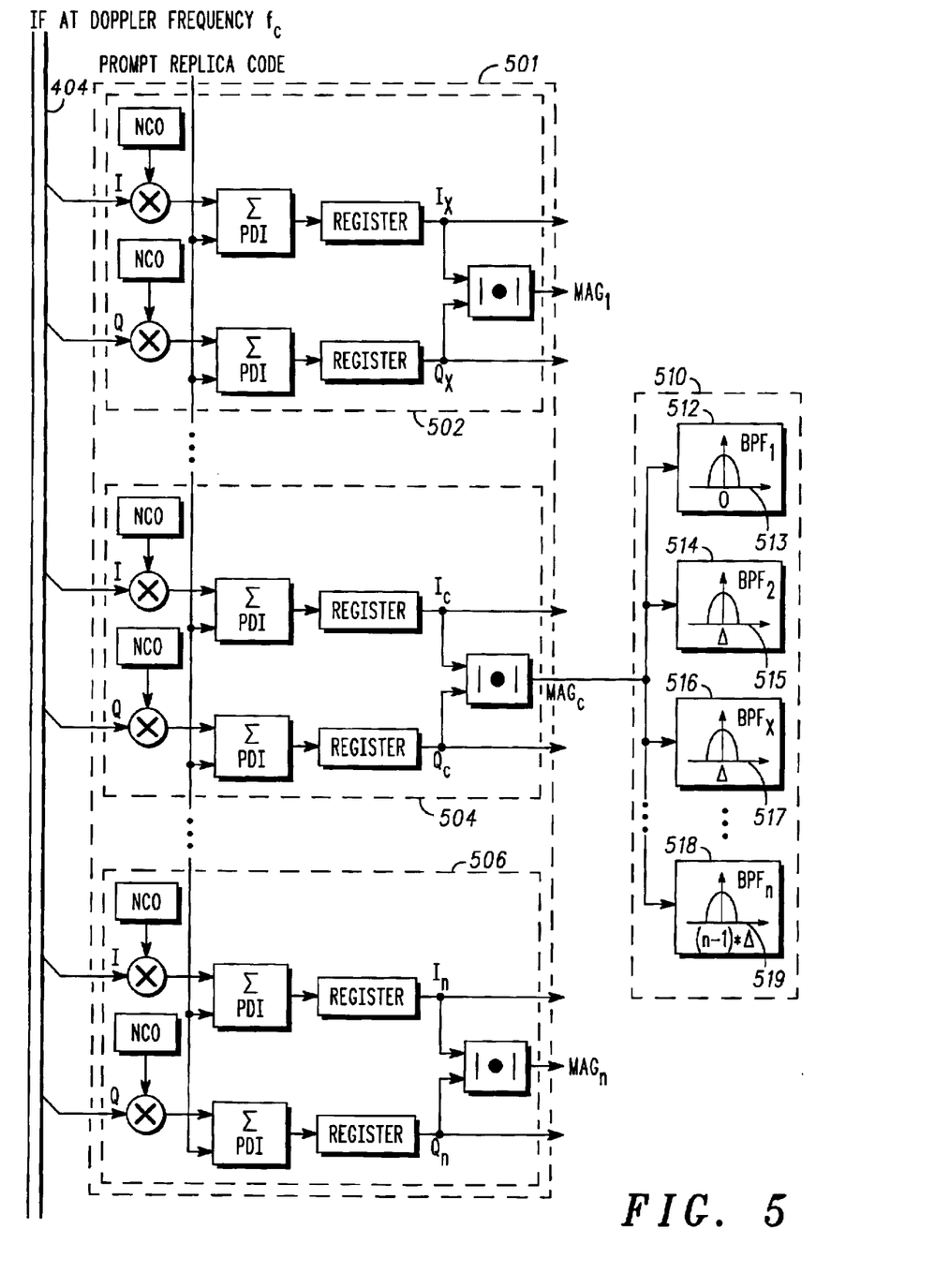
FIG. 5 is a block diagram of a frequency tine block according to the present invention.

Turning now to FIG. 5, a block diagram of a frequency tine block 501 according to the present invention is shown. The method and apparatus of the present disclosure employs a frequency diversity technique employing multiple NCOs to allow for continuous despreading of the GPS signals to accommodate reference oscillator frequency jumps. In modern GPS receivers, a downconverted signal from an RF section enters a final mixer, which will downconvert the IF signal to base band through the use of NCOs. This final down conversion is done by mixing the output of an NCO with the IF signal. The method and apparatus of the present disclosure uses many NCOs at slightly different frequencies to downconvert the IF signal.

In particular, the frequency tine block 501 of FIG. 5 comprises a plurality of frequency tines, where each frequency tines preferably include the elements of frequency tine 402 of FIG. 4. The frequency tine block 501 as shown includes a first frequency tine 502, a center frequency tine 504, and a last frequency tine 506. Although only three frequency tines are shown, it is contemplated that any number of frequency tines could be employed according to one embodiment of the present invention. A magnitude value 508 associated with the center frequency tine 504 is coupled to a comb filter 510. The comb filter 510 comprises a plurality of band pass filters, including a first band pass filter (BPF$_1$) 512 generating a first output 513, a second band pass filter (BPF$_2$) 514 generating a second output 515, an xth band pass filter (BPF$_x$) 516 generating an xth output 517 and an nth band pass filter (BPF$_n$) 518 generating an nth output 519. The center frequencies of the band pass filters start at 0 Hz and are increased by an increment of Δ Hz.

Figure 6:
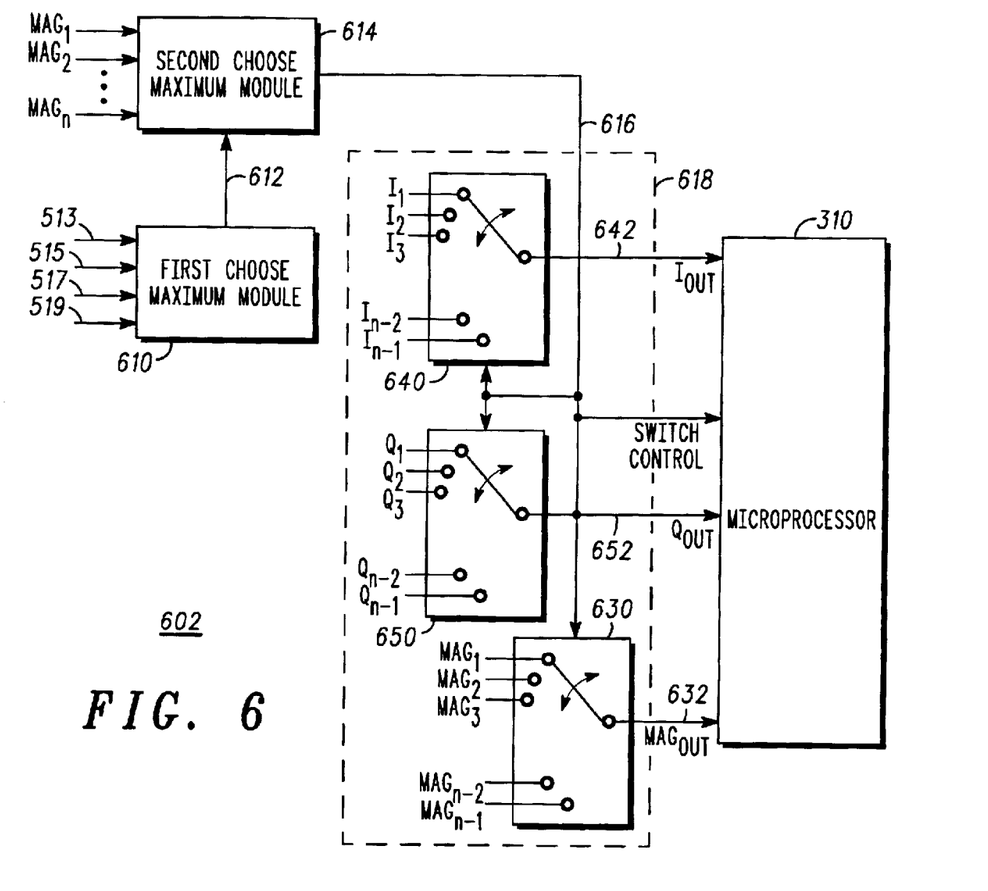
FIG. 6 is a block diagram of control circuit according to the present invention.

Turning now to FIG. 6, a block diagram of a control circuit 602 according to the present invention is shown. In particular, the control circuit 602 comprises a maximum output selector module 610 which determines the band pass filter of the comb filter 510 that is generating the greatest magnitude output, and therefore the approximate magnitude of the frequency offset of the intermediate frequency 404 from the center frequency (i.e., the frequency of the center frequency tine 504). That is, the band pass filter which passes the magnitude value 508 provides the approximate offset of the intermediate frequency 404 from the center frequency. The maximum output selector module 610 could be any comparator circuit capable of comparing the outputs 513–519.

A frequency maximum index ($I_{max}$) 612 is output from the maximum module output selector module 610, and coupled to a second maximum output selector 614. As described above, the frequency maximum signal 612 indicates the approximate magnitude of the offset, and therefore, enables the second maximum output selector module 614 to compare the magnitudes of two of the frequency tines of frequency tine block 501. The second maximum output selector module 614 could be any comparator which could determine the greater value of two magnitude values output by two frequency tines of frequency tine block 501. The comparison of magnitude values of the two frequency tines will then determine the sign of the frequency offset. Then, by knowing the magnitude and the sign of the frequency offset, it is possible to determine the approximate frequency of the intermediate frequency signal 504.

The second choose maximum module 614 also outputs a switch control signal 616 which is provided to a switch circuit 618. The switch circuit 618 is coupled to a microprocessor 310 and generally controls the I component output, the Q component output and the magnitude value which is coupled to the microprocessor. In particular, the switch circuit 618 comprises a magnitude switch 630 which generates a magnitude output ($mag_{out}$) 632 coupled to the microprocessor 310. In addition, an I component switch 640 couples an I output signal 642 to the microprocessor 310, and a Q component switch 650 generating a Q output signal 652.

In order to further understand the operation of the receiver of the present disclosure, assume that a receiver, such as the receiver shown in FIGS. 5 and 6, is tracking a wireless communication signal, such as a GPS satellite signal. Since each NCO, such as the NCOs of the plurality of frequency tines of the frequency tine block 501, operates at a slightly different frequency, only one frequency tine will be despreading the received signal at any given time. The center frequency tine 504 of the plurality of frequency tines 501 is at the nominal oscillator frequency needed for down conversion of the IF signal, having a frequency $f_{IF}$, to base band. The center frequency tine, having of center frequency '$f_c$' is the frequency tine which, if the reference oscillator is operating at its steady state frequency (i.e., no frequency jumping or phase noise) and the receiver is tracking the GPS satellite, will output a magnitude much greater than all other frequency tines. The magnitude value 508 for this frequency tine enters the comb filter 510.

Each BPF of the comb filter 510 is preferably offset in passband frequency from the previous BPF. The frequency offset is preferably the same offset used by neighboring NCOs, namely, $\Delta$ Hz. The first band pass filter 512 is centered at 0 Hz. The last or nth band pass filter 518 is at the highest pass band frequency. The BPFs are preferably identical in their transfer functions, but have different center frequency and is centered at $(n-1)\Delta$ Hz. Each BPF has a bandwidth (BW) that is less than the minimum BW that the GPS receiver can receive without losing track of a satellite. In a typical receiver, it may take a frequency jump of 25 Hz once every 10 msec for the receiver to drop out of track mode. In such a scenario, $\Delta$ would be 25 Hz. The outputs of the comb filter 510 are searched for a maximum value, for example by maximum output selector module 610. The index of the BPF which has the maximum, called '$i_{max}$' is sent to a second maximum output selector module, such as the second maximum output selector module 614. The output of the second maximum output selector module generates switch control signal 616 which controls the appropriate magnitude value and the I and Q component outputs which are sent to the microprocessor.

Assuming that $f_d$ is the offset frequency (from nominal IF carrier frequency) which occurs if the reference oscillator has a frequency jump of x Hz, then $$f_{IF}=f_c+f_d \text{ Hz}.$$

In a typical GPS receiver, a 100 ppb frequency deviation may result in a frequency deviation of 157 Hz at the IF carrier frequency. If the reference oscillator frequency is 16.367 MHz, the maximum NCO frequency is the reference oscillator frequency divided by 16. In other words, $$f_{NCO,max}=f_{ref\_osc}/16$$

If the reference oscillator deviates by a significant amount (e.g., 1 ppm), then the maximum NCO frequency deviation is 16.367/16 or 1.023 Hz. This frequency deviation is small compared to the nominal maximum NCO frequency of 1.023 MHz. Because the deviation frequency is negligibly small, it will be ignored in the frequency analysis that follows.

The spectrum at the output of the mixers of the center frequency tine 504 is generally centered on the offset frequency $f_d$ and has the bandwidth of the offset frequency +/−1 MHz. The IF signal is downconverted to $f_d$ Hz. For a 100 ppb offset, the IF signal is 157 Hz. If the correlators integrate with a pre-detection interval (PDI) of 1 msec, then they will have a bandwidth of 1000 Hz (+/−500 Hz). Since $f_d$<500 Hz, this signal will pass through the correlators in the center frequency tine 504, and result in a 1 kHz wide signal at the correlator output. The spectrum of the signal centered on the offset frequency and has a bandwidth of the offset frequency +1/(2PDI). A magnitude function, such as that provided by summer 446, will generate a magnitude value based upon the I and Q component outputs. Due to the narrow bandwidth of the BPFs and their steep rolloffs, only one bandpass filter of the comb filter 510 will have a discernable maximum. The BPF of the comb filter 510 whose center frequency is closest to $f_d$ Hz will be the BPF whose output is maximum. For example, if $f_d$=157 Hz and $\Delta$=25 Hz, BPF7 will be the BPF with the maximum. That is, $6*\Delta=6*25=150$ Hz, which is the closest frequency to 157 Hz. Note that because BPF1 is set to 0 Hz, BFP7 corresponds to $6*\Delta$ or 150 Hz. Accordingly, the maximum output selector module 610 determines which BPF has the largest output. The index, $i_{max}$, which is the index of the BPF that has the maximum output, is sent out to the second maximum output selector module. Because BPF7 has the largest output in the present example, $i_{max}=7$.

Since the BPFs of the comb filter 510 range in passband frequency from 0 to a maximum frequency, it is possible that the mixer output will be either at a positive or negative offset frequency, and it would not be possible to determine the sign of the frequency jump based solely on the BPF outputs. Accordingly, two searches are employed to determine a frequency offset according to the method and apparatus of the present disclosure. By way of example, assume that the IF frequency $f_{IF}$ is $f_c+f_d$, where $f_d$ is the offset frequency due to the frequency jump of the reference oscillator and $f_c$ is the usual nominal IF carrier frequency. If $f_d=6\Delta$Hz, the IF frequency is $f_c+6\Delta$Hz, and the outputs of the mixers of the center frequency tine are at the following frequencies:

$$f_c+6\Delta+f_c=2f_c+6\Delta \quad (1)$$

$$f_c+6\Delta-f_c=6\Delta \quad (2)$$

Now, if the $f_d=-6\Delta$ Hz, the IF frequency is now $f_c-6\Delta$ Hz. The frequencies at the mixer outputs are the following:

$$f_c-6\Delta+f_c=2f_c-6\Delta \quad (3)$$

$$f_c-6\Delta-f_c=-6\Delta \quad (4)$$

Equations (1) and (3) represent frequencies, which will not pass through the correlators due to their lowpass nature. Equations (2) and (4) only differ in sign. Since the frequency of the signal at the mixer output is symmetrical about 0 Hz, the signal in equation (4) will pass through the BPF, which is centered at $6\Delta$ Hz. As a result, it is unclear whether the frequency offset is a positive or negative offset. That is, an $f_d$ of $+/-6\Delta$ Hz will result in a signal that will pass through the BPF centered at that frequency. The second search will determine the sign of the frequency offset.

For example, if the IF frequency was $f_c-6\Delta$ Hz, then BPF7 will have the maximum output. The $1^{st}$ search for maximum module sets $i_{max}$ to 7. In this example, let the total number of frequency tines in the system be 17. Accordingly, the NCO frequency distribution versus tine number is as follows. The center NCO frequency corresponds to the $(n+1)/2$ tine. Let $n_c$ be the frequency tine index of the center frequency tine ($n_c=18/2=9$). Accordingly, one of the following tines will have the maximum output: 3 or 15. These are the tines for which the NCO frequencies are $+/-6\Delta$ from the carrier frequency. Mathematically, the index for these tines is given as follows:

$$n_c+/-(i_{max}-1)$$

Accordingly, $mag_i$ and $mag_j$, where $i=n_{c+(imax}-1)$ and $j=n_{c-(imax}-1)$, will be compared during the second search. The magnitude with the maximum will determine the value of a switch control signal, such as switch control signal 616. The switch control signal tells the switch which latched output to couple to the microprocessor. In this example, if the IF frequency was $f_c-6\Delta$, then the latched values $I_3$ and $Q_3$ would be switched over to the microprocessor as the correlator outputs for that PDI. It should be noted that a low pass filter (LPF) could be added between the switch output and the microprocessor, to further reduce frequency fluctuations.

After the maximum value and I and Q component outputs have been sent to the microprocessor, it is necessary to realign the NCO frequencies so that $f_c$ is at the NCO frequency where the maximum was found. For the current example, if $I_3$ and $Q_3$ were the I and Q component outputs from the frequency tine with the largest magnitude (i.e., $mag_3$), $f_c$ will now be set to $f_3$, wherein $f_{shift=(fc}-f_3)$ Hz. Since the reference oscillator is common to all channels, an NCO frequency shift of $f_{shift}$ Hz can be applied to the NCOs of every channel. This will help the receiver to maintain tracking or to lessen the reacquisition time necessary for those channels that lost track.

To further describe the operation of the receiver and method of the present invention, a general time line of the events which occur is summarized. The correlators finish integrating during a current PDI. The correlators dump their accumulated sums (i.e., I and Q components) to latched registers. The correlators then preferably reset their sums to 0. The correlators start accumulating again. $Mag_x$ is computed for each frequency tine using latched registers' contents. $Mag_c$ is then sent through the bank of BPFs. The maximum output selector module determines the maximum BPF output, and sets $i_{max}$ accordingly. The second maximum output selector module computes which pair of $mag_x$ values to compare given the value of $i_{max}$.

The second maximum output selector module, such as second maximum output selector module 614, then generates a switch control signal corresponding to the maximum value which was determined. The switch bridges the corresponding I and Q component outputs to the inputs of the microprocessor 310. The switch control signal is also sent to the microprocessor. The microprocessor preferably uses the value of switch control signal to compute a correction frequency, $f_{correct}$, representing the amount which the center frequency should be shifted. Let this. As normal, the frequency (or phase) tracking loop in the receiver updates the nominal NCO frequency, $f_{track\_nom}$. The corrected NCO frequency is $f_{track,nom}+f_{correct}$. The center frequency ($f_c$) is updated to be $f_{track\_nom}+f_{correct}$. All the other NCO frequencies will be updated so as to maintain their relative frequency spacing from the center frequency $f_c$.

Figure 7:
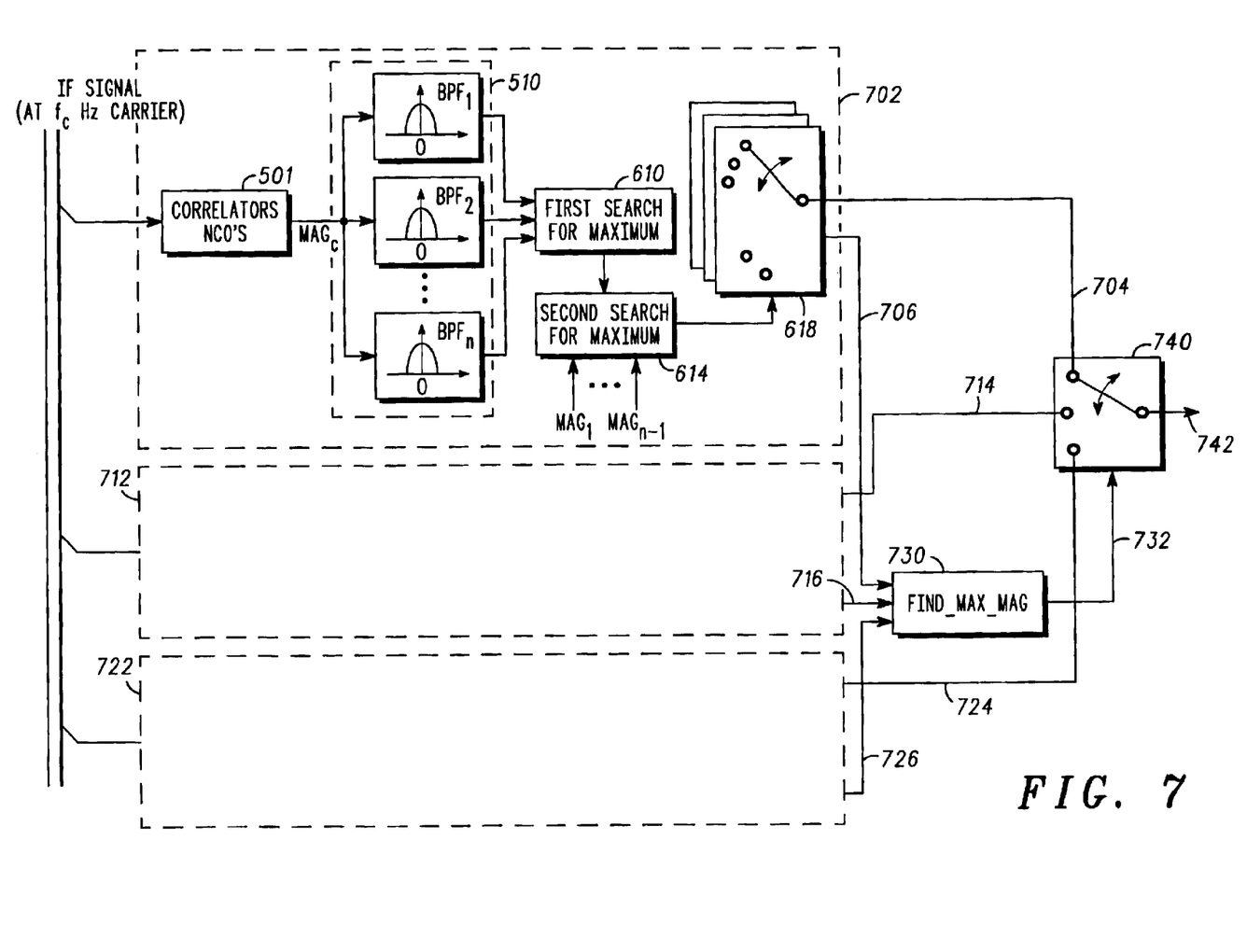
FIG. 7 is a block diagram of a wireless communication receiver according to an alternate embodiment of the present invention.

Turning now to FIG. 7, a block diagram of a wireless communication receiver according to an alternate embodiment of the present invention is shown. In particular, FIG. 7 is a plurality of sub-systems, each subsystem being similar to the receiver of FIGS. 5 and 6. That is, sub-system 702 would comprise a frequency tine block 501, which is coupled to a comb filter 510 and a control circuit 602. The outputs of the comb filter would be coupled to the maximum output selector module 610, the second maximum output selector module 614 and a switch circuit 618. The sub-system 702 outputs an I and Q component output signal 704 and a magnitude output signal 706. Similarly, a second sub-system 712 having the same elements as sub-system 702 outputs an I and Q component output signal 714 and a magnitude output signal 716, while a third sub-system 722 outputs an I and Q component output signal 724 and a magnitude output signal 726. A magnitude comparator 730 compares the magnitude output signals of the respective sub-systems to determine which sub-system is outputting the maximum at the center frequency. The magnitude comparator 730 then provides a magnitude control signal 732 to a control switch 740. The control switch then switches the appropriate I/and Q component output signals to a microprocessor by way of a control signal 742.

The wireless communication receiver having systems as shown for example in FIG. 7 accommodates reference oscillator jumps which result in IF carrier frequency jumps that are beyond the passband of the correlators of the frequency tines. For instance, if the PDI is 1 msec, the BW of the correlators is roughly +/−500 Hz. If the reference oscillator jumps by +500 ppb, then the IF carrier frequency may deviate −788 Hz from the nominal carrier frequency $f_c$ in a conventional receiver, which is clearly beyond the +/−500 Hz BW of the correlators. The wireless communication receiver of FIG. 7 having a plurality of sub-systems would accommodate such a jump in the reference frequency of the oscillator.

Figure 8:
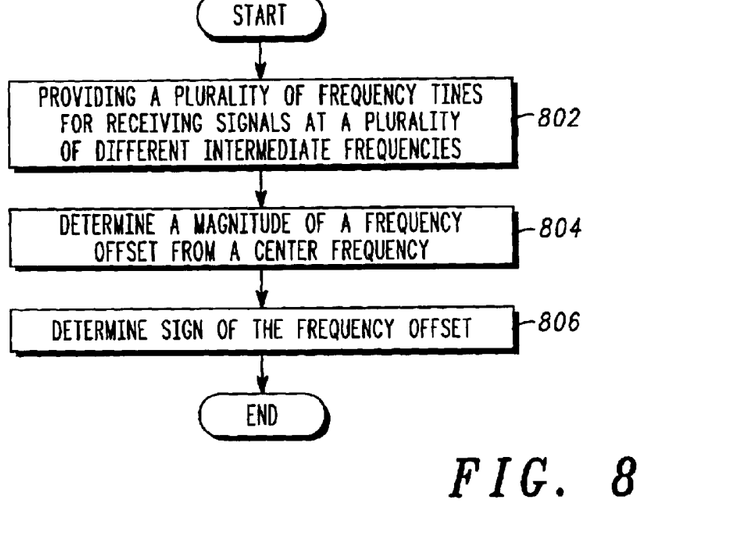
FIG. 8 is a flow chart method for determining an approximate intermediate frequency in a wireless communication device according to the present invention.

Turning now to FIG. 8, a flow chart method for determining an approximate intermediate frequency in a wireless communication receiver, such as receiver 302, according to the present invention is shown. In particular, FIG. 8 shows a plurality of frequency tines for receiving signals at a plurality of different intermediate frequencies at a step 802. An approximate magnitude of the frequency offset is then determined from a center frequency tine at a step 804. The sign of the frequency offset is then determined at a step 806.

Figure 9:
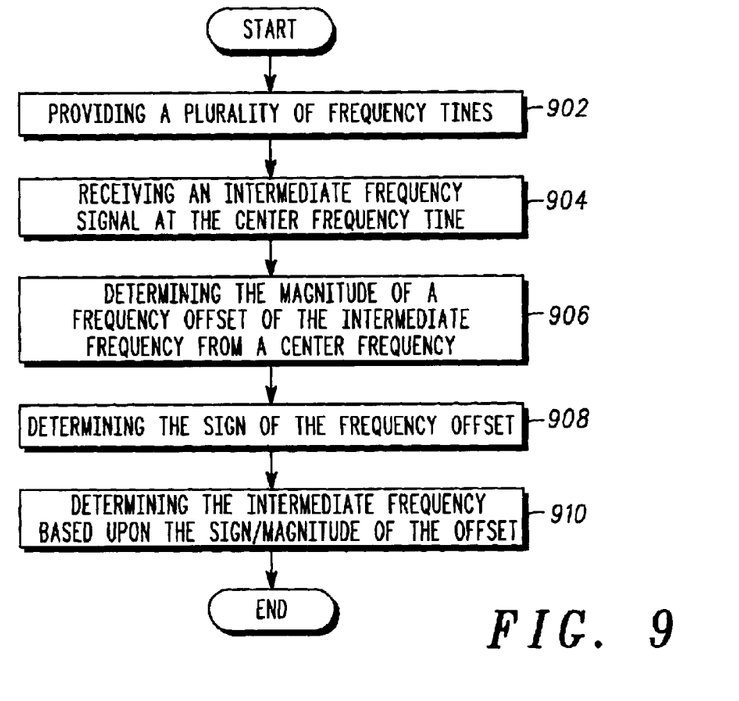
FIG. 9 is a flow chart method for determining an approximate intermediate frequency in a wireless communication device according to an alternate embodiment of the present invention.

Turning now to FIG. 9, a flow chart method for determining an approximate intermediate frequency in a wireless communication receiver, such as receiver 302, according to an alternate embodiment of the present invention is shown. In particular, FIG. 9 is a plurality of frequency tines is provided at a step 902. The frequency tines could be, for example, a frequency tine of the frequency tine block 501. An intermediate frequency signal, such as intermediate frequency signal 504, is received at a center frequency tine at a step 904. The approximate magnitude of the frequency offset of the intermediate frequency from a center frequency is then determined at a step 906. The sign of the frequency offset is then determined at a step 908. Finally, the intermediate frequency based upon the sign and magnitude of the offset is then determined at a step 910.

Figure 10:
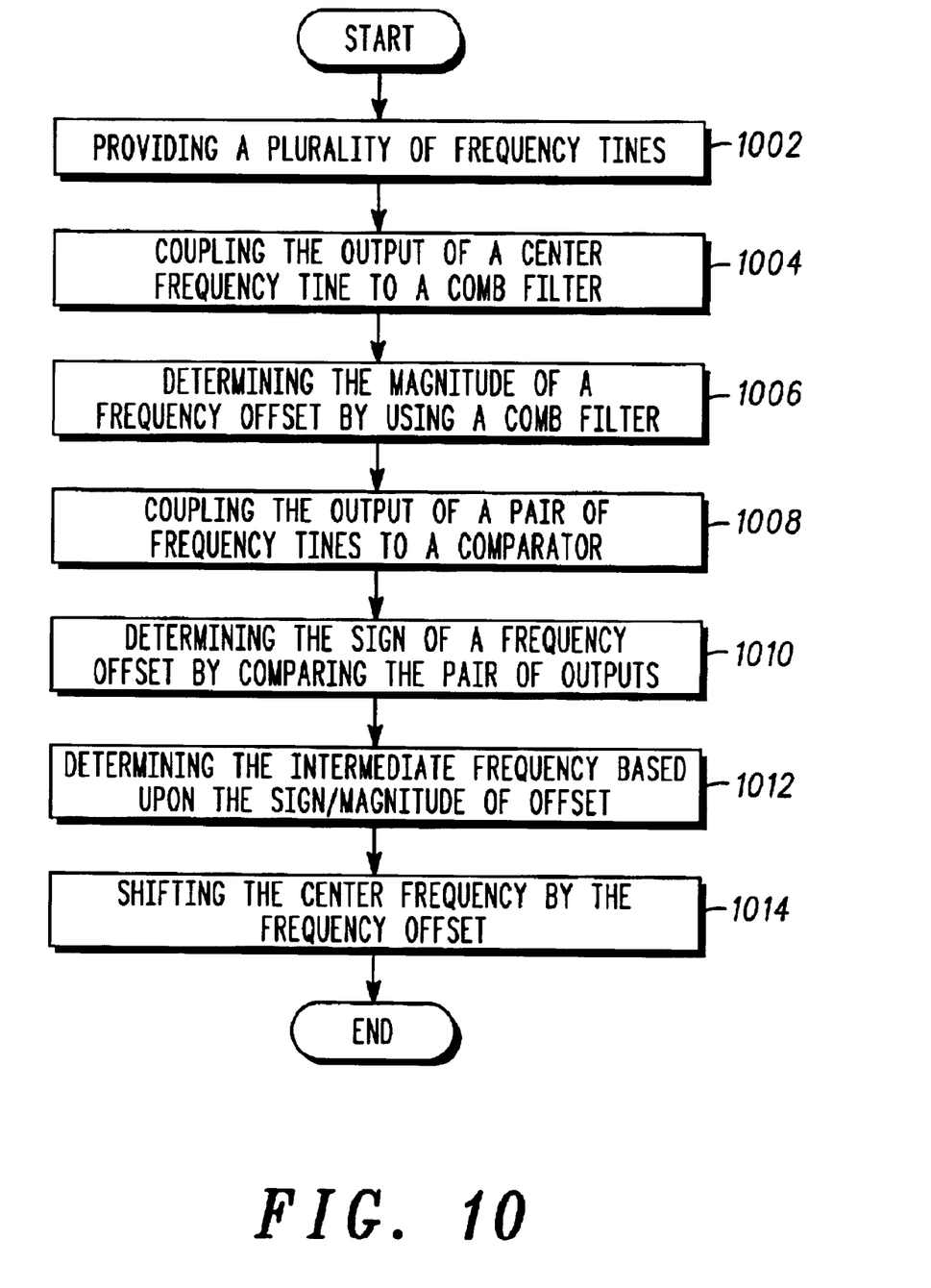
FIG. 10 is a flow chart method for determining an approximate intermediate frequency in a wireless communication device according to an alternate embodiment of the present invention.

Turning now to FIG. 10, a flow chart method for determining an approximate intermediate frequency in a wireless communication device according to an alternate embodiment of the present invention is shown. In particular, FIG. 10 is a plurality of frequency which are provided at a step 1002. The output of the center frequency tine is coupled to a band pass filter at a step 1004 to determine the approximate magnitude of the frequency offset. The output of a pair of frequency tines is then coupled to a comparator at a step 1008. In particular, the pair of frequency tines represent a frequency that is spaced apart from the center frequency by the magnitude of the offset. The sign of the frequency offset is then determined by comparing the output of the pair of frequency tines at a step 1010. The approximate intermediate frequency is then determined based upon the sign and approximate magnitude of the frequency offset at a step 1012. Finally, the center frequency of the frequency tines is then shifted by the frequency offset at a step 1014.

This invention can be used to produce a GPS receiver where an inexpensive reference oscillator can be used. Such an oscillator is typically smaller than a more stable oscillator, which means a reduction in size and weight for the receiver. Oscillators can be sensitive to vibrations. A vibration can cause an oscillator frequency to deviate. The use of this invention can eliminate the need for the additional screening required to keep vibration-sensitive oscillators out of the receivers at the time of manufacture. In automotive environments, a vibration-sensitive oscillator can have its frequency change when the automobile is being driven over a bumpy terrain (e.g., dirt roads, pot holes, big rocks with stiff suspension). The use of this invention can prevent the receiver from losing track of satellite signals when the automobile is in such an environment.

It can therefore be appreciated that the new and novel receiver and method of determining an intermediate frequency in a wireless communication device has been described. For example, it will be understood that the receiver and method of the present disclosure can be used in both the search and acquisition stages of GPS signal reception. It will be appreciated by those skilled in the art that, given the teaching herein, numerous alternatives and equivalents will be seen to exist which incorporate the disclosed invention. As a result, the invention is not to be limited by the foregoing embodiments, but only by the following claims.

What is claimed is:

1. A receiver for a wireless communication device, said receiver comprising:
   a plurality of frequency tines coupled to receive an intermediate frequency signal, each frequency tine of said plurality of frequency tines having a pair of numerically controlled oscillators;
   a comb filter coupled to a center frequency tine of said plurality of frequency tines; and
   a comparator circuit coupled to said plurality of frequency tines, said comparator circuit comparing two outputs of said plurality of frequency tines.

2. The receiver of claim 1 wherein each said frequency tine of said plurality of frequency tines comprises a pair of mixers coupled to said intermediate frequency signal, each mixer of said pair of mixers being coupled to a numerically controlled oscillator of said pair of numerically controlled oscillators.

3. The receiver of claim 2 wherein each said frequency tine of said plurality of frequency tines comprises a pair of correlators, each correlator of said pair of correlators being coupled to an output of said pair of mixers.

4. The receiver of claim 3 wherein each said frequency tine of said plurality of frequency tines comprises a pair of registers, each register of said pair of registers being coupled to an output of said pair of correlators.

5. The receiver of claim 4 wherein each said frequency tine of said plurality of frequency tines comprises a summing circuit coupled to said pair of registers, said summing circuit adding absolute values of outputs of said pair of registers.

6. The receiver of claim 1 further comprising a switch control circuit coupled to said comparator circuit.

7. The receiver of claim 6 further comprising a microprocessor coupled to said switch control circuit.

8. The receiver of claim 1 further comprising an antenna adapted to receive a GPS signal and coupled to said plurality of frequency tines.

9. The receiver of claim 8 further comprising a radio frequency circuit coupled to said antenna and generating said intermediate frequency signal.

10. A receiver for a wireless communication device, said receiver comprising:
    a radio frequency circuit coupled to receive a wireless communication signal and provide an intermediate frequency signal;
    a plurality of frequency tines coupled to receive said intermediate frequency signal from said radio frequency circuit, each frequency tine having a pair of numerically controlled oscillators;
    a comb filter coupled to a center frequency tine of said plurality of frequency tines; and
    a comparator circuit coupled to said plurality of frequency tines, said comparator circuit comparing two outputs of said plurality of frequency tines.

11. The receiver of claim 10 wherein said comb filter comprises a plurality of band pass filters.

12. The receiver of claim 11 wherein each band pass filter of said plurality of band pass filters has a different center frequency.

13. The receiver of claim 12 wherein a lowest center frequency of said different center frequencies is at 0 Hz.

14. The receiver of claim 13 wherein each said center frequency of said different center frequencies is offset from previous center frequency by a constant frequency offset.

15. A receiver for a wireless communication device, said receiver comprising:
    a plurality of frequency tines coupled to receive an intermediate frequency signal, each frequency tine having a pair of numerically controlled oscillators;
    a plurality of summing circuits, each summing circuit coupled to a predetermined frequency tine of said plurality of frequency tines, each said summing circuit generating a magnitude value of correlator outputs of said predetermined frequency tine;

a comb filter coupled to a center frequency tine of said plurality of frequency tines, said comb filter determining an offset frequency; and a comparator circuit coupled to said plurality of summing circuits, said comparator circuit comparing two magnitude values of said plurality of frequency tines based upon said offset frequency.

16. The receiver of claim 15 wherein said each frequency tine of said plurality of frequency tines comprises a pair of mixers coupled to said intermediate frequency signals, each mixer of said pair of mixers being coupled to a numerically controlled oscillator of said pair of numerically controlled oscillators.

17. The receiver of claim 16 wherein said each frequency tine of said plurality of frequency tines comprises a pair of correlators coupled to an output of said pair of mixers.

18. The receiver of claim 17 wherein said each frequency tine of said plurality of frequency tines comprises a pair of registers coupled to an output of said pair of correlators.

19. The receiver of claim 18 wherein each register retains its stored value until changed by said pair of correlators.

20. The apparatus of claim 19 wherein each said pair of registers continuously makes said stored value avoidable to a predetermined summing circuit of a plurality of summing circuits.

21. The receiver of claim 20 wherein each said predetermined summing circuit adds the absolute values of the outputs of a pair of registers.

22. The receiver of claim 15 further comprising a switch control circuit coupled to said comparator circuit.

23. The receiver of claim 22 further comprising a microprocessor coupled to said switch control circuit.

24. The receiver of claim 15 further comprising an antenna adapted to receive a GPS signal and coupled to said plurality of frequency tines.

25. The receiver of claim 24 further comprising a radio frequency circuit coupled to said antenna and generating said intermediate frequency signal.

26. A receiver for a wireless communication device, said receiver comprising:

a radio frequency circuit coupled to receive a GPS signal and generate an intermediate frequency signal;

a plurality of frequency tines coupled to receive an intermediate frequency, each frequency tine having a pair of numerically controlled oscillators;

a plurality of summing circuits, each said summing circuit being coupled to a frequency tine of said plurality of frequency tines, each said summing circuit generating a magnitude value of correlator outputs of said frequency tine;

a comb filter coupled to a center frequency tine of said plurality of frequency tines, said comb filter determining an offset frequency; and a comparator circuit coupled to said plurality of frequency tines, said comparator circuit comparing two magnitude values of said plurality of frequency tines based upon said offset frequency.

27. The receiver of claim 26 further comprising a first maximum output selector module coupled to outputs of said comb filter.

28. The receiver of claim 27 wherein said first maximum output selector module determines the magnitude of said frequency offset.

29. The receiver of claim 27 further comprising a second output selector module which determines a pair of magnitude values of said plurality of frequency tines to be compared.

30. A receiver for a wireless communication device, said receiver comprising:

a radio frequency circuit coupled to receive a GPS signal and provide an intermediate frequency signal;

a plurality of frequency tines coupled to receive an intermediate frequency, each frequency tine comprising:

a pair of numerically controlled oscillators;

a pair of mixers coupled to said intermediate frequency signals, each mixer of said pair of mixers being coupled to a numerically controlled oscillator of said pair of numerically controlled oscillators;

a pair of correlators, each correlator being coupled to an output of a mixer of said pair of mixers;

a pair of registers, each register being coupled to an output of a correlator of said pair of correlators; and a summing circuit coupled to outputs of said pair of registers to sum the absolute values of said outputs;

a comb filter coupled to a center frequency tine of said plurality of frequency tines, said comb filter determining an offset frequency; and a comparator circuit coupled to said plurality of frequency tines, said comparator circuit comparing two outputs of said plurality of frequency tines based upon said offset frequency.

31. The apparatus of claim 30 further comprising a first maximum output selector module coupled to said comb filter to determine the magnitude of said frequency offset.

32. The apparatus of claim 30 wherein said comparator circuit comprises a second maximum output selector for determining the sign of said frequency offset based upon a comparison of said two outputs.

33. The apparatus of claim 32 further comprising the switch circuit coupled to said comparator circuit.

34. The apparatus of claim 33 wherein the inputs of said switch circuit comprise the in-phase and quadrature correlator outputs, and magnitude of said in-phase and quadrature correlator outputs, of said plurality of frequency tines.

35. The apparatus of claim 34 further comprising a microprocessor coupled to said switch.

36. The switch of claim 35 wherein an output of said switch comprises the in-phase and quadrature correlator outputs, and the magnitude of said in-phase and quadrature correlator outputs, of a predetermined frequency tine.

37. The switch of claim 35 wherein an output of said switch is determined by the output of said comparator circuit.

38. The apparatus of claim 30 further comprising an antenna adapted to receive a GPS signal and coupled to said radio frequency circuit.

* * * * *